(12) United States Patent
Kato et al.

(10) Patent No.: US 8,440,566 B2
(45) Date of Patent: May 14, 2013

(54) METHOD FOR FORMING AN ALUMINUM NITRIDE THIN FILM

(75) Inventors: Koji Kato, Gunma (JP); Shoji Kano, Gunma (JP); Waichi Yamamura, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 88 days.

(21) Appl. No.: 13/189,006

(22) Filed: Jul. 22, 2011

(65) Prior Publication Data

US 2012/0100698 A1    Apr. 26, 2012

(30) Foreign Application Priority Data

Oct. 22, 2010  (JP) .................................. 2010-237138

(51) Int. Cl.
*H01L 21/44*         (2006.01)

(52) U.S. Cl.
USPC ..... 438/688; 438/680; 438/775; 257/E21.266

(58) Field of Classification Search .................. 438/680, 438/775; 257/E21.266
See application file for complete search history.

(56) References Cited

U.S. PATENT DOCUMENTS

| 2009/0011610 A1* | 1/2009 | Bojarczuk et al. ............. 438/763 |
| 2011/0056542 A1* | 3/2011 | Quick et al. .................. 136/255 |

FOREIGN PATENT DOCUMENTS

| JP | 3024712 B2 | 1/2000 |
| JP | 2007-16272 A | 1/2007 |

* cited by examiner

*Primary Examiner* — Michelle Mandala
(74) *Attorney, Agent, or Firm* — Seed IP Law Group PLLC

(57) ABSTRACT

The method is adapted for forming an aluminum nitride thin film having a high density and a high resistance to thermal shock by a chemical vapor deposition process and includes steps of mixing a gas containing aluminum atoms (Al) and a gas containing nitrogen atoms (N) with a gas containing oxygen atoms (O) and feeding the mixture to a member to be covered by an aluminum nitride thin film.

9 Claims, 5 Drawing Sheets

F I G. 4
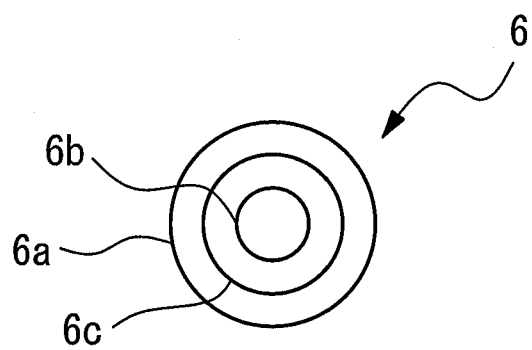
F I G. 5
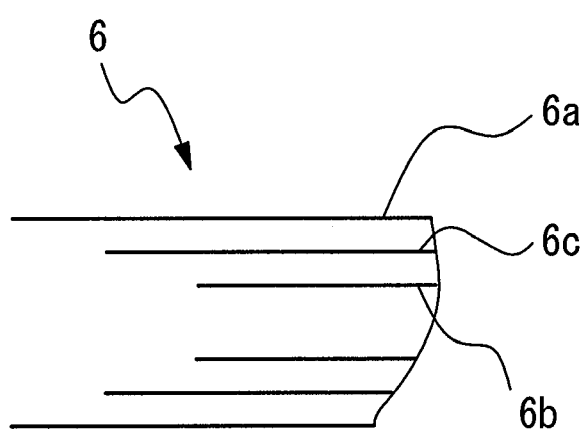

F I G. 6
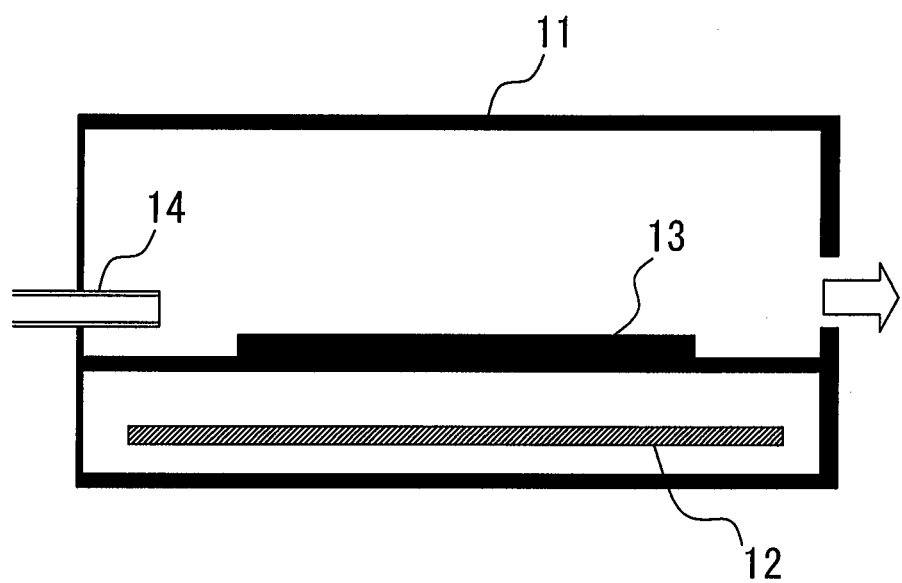

METHOD FOR FORMING AN ALUMINUM NITRIDE THIN FILM

BACKGROUND

1. Technical Field

The present invention relates to a method for forming an aluminum nitride thin film having a high resistance to thermal shock and having a high density on a member used in a process for manufacturing a semiconductor.

2. Description of the Related Art

In a dry process for manufacturing a semiconductor, a high-reactivity halogenous corrosive gas such as a fluorine-containing gas, a chlorine-containing gas or the like is often used as a gas for etching and cleaning and, therefore, a member which is to come into contact with such a high reactive gas is required to have a high corrosion resistance.

As members other than the member to be processed, which would come into contact with the high corrosive gas, it has been found that a sintered body of aluminum oxide, aluminum nitride, aluminum oxynitride or the like is preferable since it has a high corrosive resistance against a halogenous corrosive gas.

In addition, the thin film forming technique for forming a thin film of aluminum oxide, aluminum nitride or aluminum oxynitride on an inexpensive member such as metal, carbon or the like using a flame spraying method, a sputtering method, or a chemical vapor deposition method has been recently developed.

On the other hand, it is known that aluminum oxide and aluminum oxynitride exhibit a higher corrosion resistance against a fluorine-containing gas than that of aluminum nitride, and Japanese Patent No. 3024712 (Patent Publication No. 1) discloses an Al—O—N series composite material containing aluminum nitride (AlN), aluminum oxide (AlxOy) and aluminum oxynitride (AlxNyOz) and a synthesis process for manufacturing it.

However, the thin film formed of aluminum oxide or aluminum oxynitride having a higher coefficient of thermal expansion than aluminum nitride has a low resistance to thermal shock and tends to be cracked and split. Japanese Patent Application Laid Open 2007-16272 (Patent Publication No. 2) discloses that it is possible to ensure the dimensional stability and mechanical strength of a thin film and decrease the number of cracks formed therein by forming a protection film made of aluminum nitride (AlN), aluminum oxide (AlxOy), aluminum oxynitride (AlxNyOz) or a combination thereof on a substrate made of pyrolytic boron nitride (pBN), pyrolytic graphite (PG) and/or boron nitride to which carbon is doped and applying a compression stress to the thus formed thin film. However, since whether a stress applied to the thin film is a compression stress or a tensile stress depends upon the coefficient of thermal expansion of the material used for forming the thin film, the teaching of Patent Publication No. 2 can be applied only to a material having a certain coefficient of thermal expansion.

Members used in a semiconductor manufacturing process such as a susceptor, clamp ring, heater and the like have recently been grown in sizes larger than $\phi$ 300 mm (twelve inches) and since a thermal stress applied to the member becomes larger along with the growth in size, it is difficult to use as material for forming these members a sintered body of aluminum oxide or aluminum oxynitride which, while exhibiting a higher corrosion resistance than that of aluminum nitride against a fluorine-containing gas, has a low resistance to thermal shock.

Further, even in the case of covering the surface of members used in a semiconductor manufacturing process other than the member to be processed with a conventional aluminum nitride thin film, the member becomes larger along with the growth in size of a wafer and it is therefore necessary to enlarge the size of the space of the chamber of the film forming apparatus. As a consequence, since a source gas for forming an aluminum nitride thin film has to travel a long distance up to the member to be processed, the source gas reacts before arriving at the member to be processed to form aluminum nitride particles. As a result, the aluminum nitride thin film formed on the surface of the member to be processed under the conventional thin film forming condition becomes a powdery film and an aluminum nitride thin film having a high density therefore cannot be formed.

SUMMARY OF THE INVENTION

It is therefore an object of the present invention to provide a method for forming an aluminum nitride thin film having a high density and a high resistance to thermal shock by a chemical vapor deposition process.

The inventors of the present invention vigorously pursued a study for accomplishing the above object and, as a result, made the surprising discovery that an aluminum nitride thin film having a high density and a high resistance to thermal shock can be formed by mixing a gas containing aluminum atoms (Al) and a gas containing nitrogen atoms (N) with a gas containing oxygen atoms (O) and feeding the mixture to a member to be covered by an aluminum nitride thin film.

The present invention is based on this finding and the above and other objects can be accomplished by feeding a gas containing aluminum atoms (Al), feeding a gas containing nitrogen atoms (N) and feeding a gas containing oxygen atoms (O) to an apparatus for forming an aluminum nitride thin film.

Although it is not altogether clear why an aluminum nitride thin film having a high density can be formed by feeding a gas containing aluminum atoms (Al), a gas containing nitrogen atoms (N) and a gas containing oxygen atoms (O) to an apparatus for forming an aluminum nitride thin film, it is reasonable to conclude that reaction of the gas containing aluminum atoms (Al) and the gas containing nitrogen atoms (N) is suppressed by mixing a gas containing aluminum atoms (Al) and a gas containing nitrogen atoms (N) with a gas containing oxygen atoms (O) and the production of aluminum nitride is delayed in time.

In the present invention, it is preferable to feed the gas containing aluminum atoms (Al) and the gas containing nitrogen atoms (N) via different flow passages to the apparatus for forming an aluminum nitride thin film.

In the present invention, the gas containing oxygen atoms (O) may be fed via a flow passage different from the flow passage of the gas containing aluminum atoms (Al) or flow passage of the gas containing nitrogen atoms (N) to the apparatus for forming an aluminum nitride thin film, may be fed to the flow passage of the gas containing nitrogen atoms (N) to be mixed with the gas containing nitrogen atoms (N), thereby feeding it to the apparatus for forming an aluminum nitride thin film or may be fed to the flow passage of the gas containing aluminum atoms (Al) to be mixed with the gas containing aluminum atoms (Al), thereby feeding it to the apparatus for forming an aluminum nitride thin film.

In the present invention, it is preferable to feed the gas containing aluminum atoms (Al) and the gas containing oxygen atoms (O) into the apparatus for forming an aluminum nitride thin film so that the molar ratio (Al/O) of the aluminum atoms (Al) to the oxygen atoms (O) is equal to or larger than 1 and equal to or smaller than 100 ($1 \leq Al/O \leq 100$) and a more preferable molar ratio (Al/O) of the aluminum atoms (Al) to the oxygen atoms (O) is equal to or larger than 5 and equal to or smaller than 30 ($5 \leq Al/O \leq 30$).

In the present invention, it is preferable for the gas supply pipes for feeding the gas containing aluminum atoms (Al), the gas containing nitrogen atoms (N) and the gas containing oxygen atoms (O) to the apparatus for forming an aluminum nitride thin film to have a double structure or a triplex structure.

In the present invention, the gas containing oxygen atoms (O) is selected from a group consisting of an $O_2$ gas, an $H_2O$ gas, an NOx gas and a COx gas.

In the present invention, the gas containing aluminum atoms (Al) is selected from a group consisting of a trimethylaluminum gas (TMA) and an aluminum chloride gas.

In the present invention, in the case where a member provided in the apparatus for forming an aluminum nitride thin film and to be brought into contact with the gas containing oxygen atoms (O) is made of carbon, prior to feeding the gas containing oxygen atoms (O) into the apparatus for forming an aluminum nitride thin film, it is preferable to feed a gas which contains a compound selected from a group consisting of pyrolytic boron nitride (pBN), pyrolytic graphite (PG), boron containing pyrolytic graphite (B-PG), aluminum nitride (AlN) and silicon carbide (SiC) but does not contain oxygen atoms (O) and cover the surface of the member made of carbon with the compound selected from a group consisting of pyrolytic boron nitride (pBN), pyrolytic graphite (PG), boron containing pyrolytic graphite (B-PG), aluminum nitride (AlN) and silicon carbide (SiC) contained in the gas which does not contain any oxygen atoms.

The above and other objects and features of the present invention will become apparent from the following description made with reference to the accompanying drawings.

BRIEF DESCRIPTION OF THE DRAWINGS

FIG. 4 is a schematic front view showing a gas supply pipe provided in an apparatus used for carrying out a method for forming an aluminum nitride thin film which is used in another preferred embodiment of the present invention.

FIG. 5 is a schematic longitudinal cross sectional view showing the gas supply pipe shown in FIG. 4.

FIG. 6 is a schematic longitudinal cross sectional view showing a gas supply pipe provided in an apparatus used for carrying out for forming an aluminum nitride thin film which is used in a further preferred embodiment of the present invention.

DESCRIPTION OF THE PREFERRED EMBODIMENTS

Figure 1:
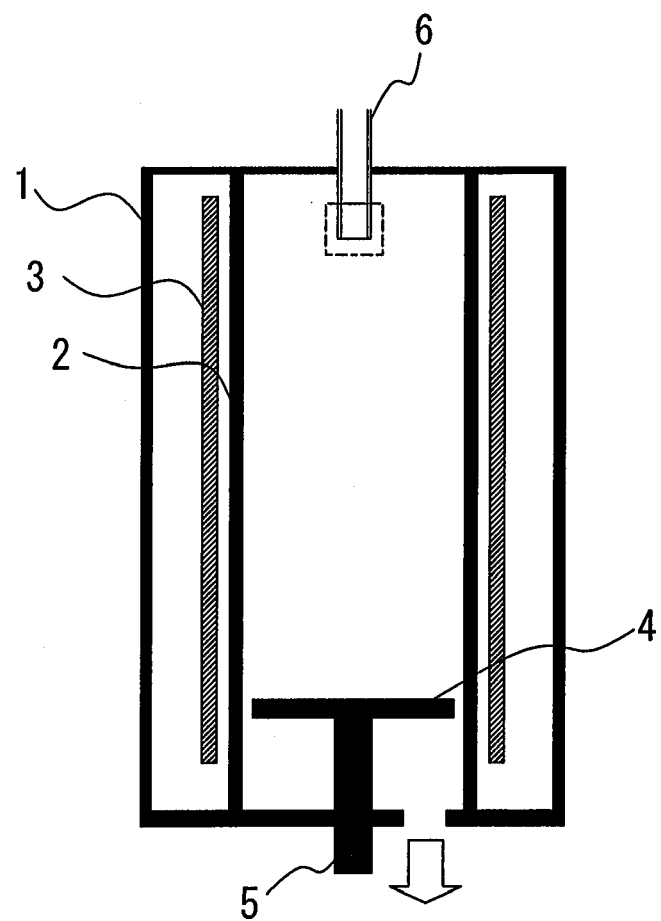
FIG. 1 is a schematic longitudinal cross sectional view showing an apparatus used for carrying out a method for forming an aluminum nitride thin film which is a preferred embodiment of the present invention.

FIG. 1 is a schematic longitudinal cross sectional view showing an apparatus used for carrying out a method for forming an aluminum nitride thin film which is a preferred embodiment of the present invention.

As shown in FIG. 1, the apparatus for forming an aluminum nitride thin film which is a preferred embodiment of the present invention has an upright structure and includes an external cylinder 1 made of carbon, an internal cylinder 2 made of carbon, a heater 3 made of carbon and disposed between the external cylinder 1 and the internal cylinder 2, a stage 4 made of carbon on which a member to be processed and covered with aluminum nitride is placed, a rotation mechanism 5 for rotating the stage 4 so that the film thickness distribution of aluminum nitride formed on the surface of the member becomes uniform, and a gas supply pipe 6 for feeding a source gas into the internal cylinder 2.

Figure 2:
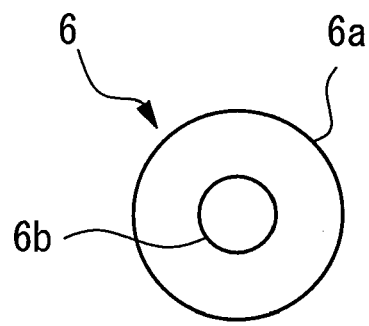
FIG. 2 is a schematic front view showing a gas supply pipe viewed from the upper side provided in the apparatus used for carrying out a method for forming an aluminum nitride thin film shown in FIG. 1.
Figure 3:
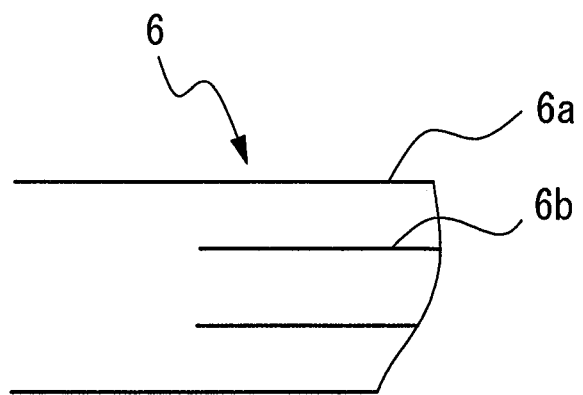
FIG. 3 is a schematic longitudinal cross sectional view showing a gas supply pipe provided in the apparatus used for carrying out a method for forming an aluminum nitride thin film shown in FIG. 1.

FIG. 2 is a schematic front view showing a gas supply pipe viewed from the upper side provided in the apparatus used for carrying out the method for forming an aluminum nitride thin film shown in FIG. 1, and FIG. 3 is a schematic longitudinal cross sectional view showing the gas supply pipe.

As shown in FIG. 2 and FIG. 3, the gas supply pipe 6 has a double structure and includes an external pipe 6a and an internal pipe 6b.

In this preferred embodiment, the temperature inside the apparatus for forming an aluminum nitride thin film is controlled to 100° C., for example, and a gas prepared by mixing a gas containing nitrogen atoms (N) such as an ammonia gas or the like and having a high temperature and a gas containing oxygen atoms (O) such as an $O_2$ gas, an $H_2O$ gas, a NOx gas, a COx gas or the like and having a high temperature is fed into the internal cylinder 2 of the apparatus for forming an aluminum nitride thin film via the external pipe 6a of the gas supply pipe 6, while a gas containing aluminum atoms (Al) such as a trimethylaluminum gas (TMA) or an aluminum chloride gas and having a high temperature is fed into the internal cylinder 2 of the apparatus for forming an aluminum nitride thin film via the internal pipe 6b of the gas supply pipe 6.

Since gases having a high temperature are supplied via the gas supply pipe 6 in this manner, the external pipe 6a and the internal pipe 6b of the gas supply pipe 6 are made of a material having a high heat resistance such as pyrolytic boron nitride (pBN), silicon carbide (SiC), silicon oxide (SiO2), a high melting point metal or the like.

In the apparatus for forming an aluminum nitride thin film shown in FIGS. 1 to 3, since the external cylinder 1, the internal cylinder 2, the heater 3 and the stage 4 are made of inexpensive carbon, if the gas containing oxygen atoms (O) and having a high temperature is fed into the internal cylinder 2, oxygen atoms (O) contained in the gas react with the external cylinder 1 made of carbon, the internal cylinder 2 made of carbon, the heater 3 made of carbon and the stage 4 made of carbon, whereby they are consumed. Thus, the gas containing oxygen atoms (O) and having a high temperature cannot be fed into the apparatus for forming an aluminum nitride thin film.

Therefore, in this preferred embodiment, prior to forming an aluminum nitride thin film, a gas containing no oxygen atoms is fed into the internal cylinder 2 to cover the surface of the external cylinder 1 made of carbon, the surface of the internal cylinder 2 made of carbon, the surface of the heater 3 made of carbon and the surface of the stage 4 made of carbon with the constituent contained in the above mentioned gas and thereafter, a gas containing oxygen atoms (O) is fed into the internal cylinder 2.

In the case of covering the surface of a member to be processed with an aluminum nitride thin film using the thus constituted apparatus for forming an aluminum nitride thin film, a gas containing pyrolytic boron nitride (pBN), pyrolytic graphite (PG), boron containing pyrolytic graphite (B-PG), aluminum nitride (AlN), silicon carbide (SiC) or the like and containing no oxygen atoms is fed into the internal cylinder 2 and the surface of the external cylinder 1, the surface of the internal cylinder 2, the surface of the heater 3 and the surface of the stage 4 are covered with the compound such as pyrolytic boron nitride (pBN) or the like contained in the gas which does not contain oxygen.

Then, a member to be processed and covered with an aluminum nitride thin film is placed on the stage 4.

In this manner, when the surface of the external cylinder 1, the surface of the internal cylinder 2, the surface of the heater 3 and the surface of the stage 4 have been covered with the compound such as pyrolytic boron nitride (pBN) or the like contained in the gas which does not contain oxygen atoms (O), the stage 4 on which the member to be processed and covered with an aluminum nitride thin film is placed is rotated by the rotating mechanism 5 and a mixed gas prepared by mixing a gas containing nitrogen atoms (N) such as an ammonia gas or the like and a gas containing oxygen atoms (O) such as an oxygen gas or the like is fed into the internal cylinder 2 of the apparatus for forming an aluminum nitride thin film via the external pipe 6a of the gas supply pipe 6, and on the other hand, a gas containing aluminum atoms (Al) such as a trimethylaluminum gas (TMA), an aluminum chloride gas or the like is fed into the internal cylinder 2 of the apparatus for forming an aluminum nitride thin film via the internal pipe 6b of the gas supply pipe 6.

As a result, since the gas containing nitrogen atoms (N) such as an ammonia gas or the like, the gas containing oxygen atoms (O) such as an $O_2$ gas, an $H_2O$ gas, a NOx gas, a COx gas or the like and the gas containing aluminum atoms (Al) such as a trimethylaluminum gas (TMA), an aluminum chloride gas or the like are mixed with each other and then, the mixed gas arrives at the surface of the member to be processed, and the composition ratio of the nitrogen atoms (N), the oxygen atoms (O) and the aluminum atoms (Al) can be controlled in the desired manner. Therefore, it is possible to form an aluminum nitride thin film having a desired composition ratio of nitrogen atoms (N), the oxygen atoms (O) and the aluminum atoms (Al) on the surface of the member to be processed.

Here, the molar ratio (Al/O) of aluminum atoms (Al) contained in the gas containing aluminum atoms (Al) and supplied into the internal cylinder 2 of the apparatus for forming an aluminum nitride thin film via the internal pipe 6b of the gas supply pipe 6 to oxygen atoms (O) contained in the gas containing oxygen atoms (O) and supplied into the internal cylinder 2 of the apparatus for forming an aluminum nitride thin film via the external pipe 6a of the gas supply pipe 6 is preferably set to be equal to or larger than 1 and equal to or smaller than 100, namely, the molar ratio is preferably set to be $1 \leq Al/O \leq 100$. In the case where the molar ratio (Al/O) of aluminum atoms (Al) and oxygen atoms (O) supplied into the apparatus for forming an aluminum nitride thin film is less than 1, the influence of supplying the gas containing oxygen atoms (O) in addition to the gas containing nitrogen atoms (N) and the gas containing aluminum atoms (Al) becomes too strong, whereby the aluminum oxide crystalline phase or an aluminum oxynitride crystalline phase is formed in an aluminum nitride thin film formed on the surface of the member to be processed and the resistance to thermal shock of the aluminum nitride thin film becomes undesirably low. On the other hand, in the case where the molar ratio (Al/O) of aluminum atoms (Al) and oxygen atoms (O) supplied into the apparatus for forming an aluminum nitride thin film exceeds 100, the influence of supplying the gas containing oxygen atoms (O) in addition to the gas containing nitrogen atoms (N) and the gas containing aluminum atoms (Al) becomes too weak, whereby the aluminum nitride thin film formed on the surface of the member to be processed undesirably becomes a powdery film. If the molar ratio (Al/O) of aluminum atoms (Al) and oxygen atoms (O) is equal to or higher than 5 and equal to or smaller than 30, namely, the molar ratio is preferably set to be ($5 \leq Al/O \leq 30$), it is possible to form an aluminum nitride thin film having a higher density and more preferable.

As stated above, in this preferred embodiment of the present invention, since the apparatus for forming an aluminum nitride thin film is constituted so that the gas containing nitrogen atoms (N) such as an ammonia gas or the like is fed into the internal cylinder 2 via the external pipe 6a of the gas supply pipe 6 and the gas containing aluminum atoms (Al) such as a trimethylaluminum gas (TMA), an aluminum chloride gas or the like is fed into the internal cylinder 2 via the internal pipe 6b of the gas supply pipe 6, it is possible to effectively prevent nitrogen and aluminum from reacting with each other before the gas containing nitrogen atoms (N) and the gas containing the aluminum atoms (Al) arrive at the member to be processed placed on the stage 4 of the apparatus for forming the aluminum nitride thin film, whereby aluminum nitride particles are produced so that the aluminum nitride thin film formed on the surface of the member to be processed becomes a powdery film.

Further according to this preferred embodiment, the mixed gas prepared by mixing the gas containing nitrogen atoms (N) such as an ammonia gas or the like and the gas containing oxygen atoms (O) such as an oxygen gas is fed to the inner cylinder 2 of the apparatus for forming an aluminum nitride thin film via the external pipe 6a of the gas supply pipe 6, while the gas containing aluminum atoms (Al) such as a trimethylaluminum gas, an aluminum chloride gas or the like is fed into the internal cylinder 2 via the internal pipe 6b of the gas supply pipe 6. It is therefore possible to form an aluminum nitride thin film having a high resistance to thermal shock and having a high density.

FIG. 4 is a schematic front view showing a gas supply pipe 6 provided in an apparatus for forming an aluminum nitride thin film which is another preferred embodiment of the present invention and FIG. 5 is a schematic longitudinal cross sectional view showing the gas supply pipe 6 shown in FIG. 4. An apparatus for forming an aluminum nitride thin film according to this preferred embodiment is different from the apparatus for forming an aluminum nitride thin film shown in FIGS. 1 to 3 only in the structure of a gas supply pipe 6.

As shown in FIGS. 4 and 5, a gas supply pipe 6 provided in the apparatus for forming an aluminum nitride thin film according to this preferred embodiment has a triplex structure including an external pipe 6a, a middle pipe 6c and an internal pipe 6b.

In this apparatus for forming aluminum nitride thin film, an external cylinder (not shown), an internal cylinder (not shown), a heater (not shown) and a stage (not shown) are all made of inexpensive carbon. Thus, similarly to the apparatus for forming aluminum nitride thin film shown in FIGS. 1 to 3, in this preferred embodiment, prior to forming an aluminum nitride thin film, a gas containing pyrolytic boron nitride (pBN), pyrolytic graphite (PG), boron containing pyrolytic graphite (B-PG), aluminum nitride (AlN), silicon carbide (SiC) or the like and containing no oxygen atoms is fed into the internal cylinder 2 to cover the surface of the external cylinder 1 made of carbon, the surface of the internal cylinder 2 made of carbon, the surface of the heater 3 made of carbon and the surface of the stage 4 made of carbon with the constituent contained in the above mentioned gas and thereafter, a gas containing oxygen atoms (O) is fed into the internal cylinder 2.

In this preferred embodiment, a gas containing nitrogen atoms (N) such as an ammonia gas or the like is fed into the internal cylinder 2 via the external pipe 6a of the gas supply pipe 6 and a gas containing oxygen atoms (O) such as an $O_2$ gas, an $H_2O$ gas, a NOx gas, a COx gas or the like is fed into the internal cylinder 2 via the middle pipe 6c of the gas supply pipe 6. On the other hand, a gas containing aluminum atoms (Al) such as a trimethylaluminum gas, an aluminum chloride gas or the like is fed into the internal cylinder 2 via the internal pipe 6b of the gas supply pipe 6.

Similarly to the above described preferred embodiment, since the apparatus for forming an aluminum nitride thin film according to this preferred embodiment is constituted so that the gas containing nitrogen atoms (N) such as an ammonia gas or the like is fed into the internal cylinder 2 via the external pipe 6a of the gas supply pipe 6 and the gas containing aluminum atoms (Al) such as a trimethylaluminum gas, an aluminum chloride gas or the like is fed into the internal cylinder 2 via the internal pipe 6b of the gas supply pipe 6, it is possible to effectively prevent nitrogen and aluminum from reacting with each other before the gas containing nitrogen atoms (N) and the gas containing aluminum atoms (Al) arrive at the member to be processed placed on the stage 4 of the apparatus for forming the aluminum nitride thin film, whereby aluminum nitride particles are produced in the aluminum nitride thin film so that the aluminum nitride thin film formed on the surface of the member to be processed becomes a powdery film Further, according to this preferred embodiment, the gas containing nitrogen atoms (N) such as an ammonia gas or the like is fed into the internal cylinder 2 via the external pipe 6a of the pipe supply pipe 6 and the gas containing the oxygen atoms (O) such as an oxygen gas or the like is fed into the internal cylinder 2 via the middle pipe 6c of the pipe supply pipe 6, while the gas containing the aluminum atoms (Al) such as a trimethylaluminum gas, an aluminum chloride gas or the like is fed into the internal cylinder 2 via the internal pipe 6b of the pipe supply pipe 6. Thus, it is possible to form an aluminum nitride thin film having a high resistance to thermal shock and having a high density.

FIG. 6 is a schematic longitudinal cross sectional view showing a gas supply pipe provided in an apparatus for forming an aluminum nitride thin film which is a further preferred embodiment of the present invention.

As shown in FIG. 6, an apparatus for forming an aluminum nitride thin film according to this preferred embodiment is constituted to have a horizontal structure and includes a circular cylinder 11 made of carbon and there are provided in the circular cylinder 11 a heater 12 made of carbon, a stage 13 made of carbon on which a member to be processed is placed and a gas supply pipe 14 for supplying a source gas into the circular cylinder 11.

Although not shown in FIG. 6, the gas supply pipe 14 may have a double structure similarly to the gas supply pipe 6 shown in FIGS. 2 and 3, or the gas supply pipe 14 may have a triplex structure similarly to the gas supply pipe 6 shown in FIGS. 4 and 5.

In the case where the gas supply pipe 14 is formed to have a double structure, similarly to the apparatus for forming aluminum nitride thin film shown in FIGS. 1 to 3, a mixed gas prepared by mixing a gas containing the oxygen atoms (O) and a gas containing the nitrogen atoms (N) is fed into the circular cylinder 11 via an external pipe (not shown) of the gas supply pipe 14 while a gas containing aluminum atoms (Al) is fed into the circular cylinder 11 via an internal pipe (not shown) of the gas supply pipe 14, whereby an aluminum nitride thin firm is formed on the surface of the member to be processed placed on the stage 13.

On the other hand, in the case where the gas supply pipe 14 is formed to have a triplex structure, similar to the apparatus for forming aluminum nitride thin film shown in FIGS. 4 and 5, a gas containing the nitrogen atoms (N) such as an ammonia gas or the like is fed into the circular cylinder 11 via an external pipe (not shown) of the gas supply pipe 14 and a gas containing the oxygen atoms (O) such as an oxygen gas or the like is fed into the circular cylinder 11 via a middle pipe (not shown) of the gas supply pipe 14 while a gas containing aluminum atoms (Al) such as a trimethylaluminum gas, an aluminum chloride gas or the like is fed into the circular cylinder 11 via an internal pipe (not shown) of the gas supply pipe 14. As a result, an aluminum nitride thin film is formed on the surface of the member to be processed and placed on the stage 13.

According to this preferred embodiment, the gas containing the nitrogen atoms (N) and the gas containing aluminum atoms (Al) are fed into the circular cylinder 11 of the apparatus for forming aluminum nitride thin film via spaces divided from each other in the gas supply pipe 14. Therefore, it is possible to effectively prevent nitrogen and aluminum from reacting with each other before the gas containing nitrogen atoms (N) and the gas containing aluminum atoms (Al) are fed into the circular cylinder 11, whereby aluminum nitride particles are produced so that the aluminum nitride thin film formed on the surface of the member to be processed becomes a powdery film.

Further, in this preferred embodiment, since the gas containing oxygen atoms (O) is fed into the circular cylinder 11 of the apparatus for forming an aluminum nitride thin film in addition to the gas containing nitrogen atoms (N) and the gas containing aluminum atoms (Al), it is possible to form an aluminum nitride thin film having a high resistance to thermal shock and having a high density.

WORKING EXAMPLES AND A COMPARATIVE EXAMPLE

Hereinafter, working examples and comparative examples will be set out in order to further clarify the technical advantages of the present invention.

Working Example 1

An apparatus for forming an aluminum nitride thin film which included a gas supply pipe having a double structure as shown in FIGS. 1 to 3, had a size of $\phi$500 mm×1500 mm and an upright structure was prepared and a base material having a size of 50 mm×50 mm×1 mm was placed on a stage of the apparatus for forming an aluminum nitride thin film. Then, an aluminum nitride thin film was formed on the surface of the base material in the following manner.

An aluminum nitride (AlN) gas was first fed into the apparatus for forming an aluminum nitride thin film via the gas supply pipe, thereby forming an aluminum nitride thin film on the surfaces of the external cylinder made of carbon, the internal cylinder made of carbon, the heater made of carbon and the stage made of carbon. Thereafter, a member to be processed was placed on the stage of the apparatus for forming an aluminum nitride thin film.

Next, the temperature in the apparatus for forming an aluminum nitride thin film was controlled at 1,000° C. and the pressure in the apparatus for forming an aluminum nitride thin film was controlled at 100 Pa. Then, a mixed gas prepared by mixing an ammonia gas and oxygen gas was fed into the internal cylinder of the apparatus for forming an aluminum nitride thin film via an external pipe of the gas supply pipe and a trimethylaluminum (TMA) gas was fed into the internal cylinder of the apparatus for forming an aluminum nitride thin film via an internal pipe of the gas supply pipe, thereby forming an aluminum nitride thin film having a thickness of 100 μm on the surface of the base material having the size of 50 mm×50 mm×1 mm.

Here, the molar ratio (Al/O) of aluminum atoms (Al) contained in the trimethylaluminum (TMA) gas fed into the internal cylinder to oxygen atoms (O) contained in the oxygen gas fed into the internal cylinder was controlled to be 10.

An X-ray diffraction profile of the thus formed aluminum nitride thin film in the range between 2θ=20° to 80° was measured using "X-ray diffraction RINT-2500 VHF" (Product Name) manufactured by Rigaku Corporation.

Figure 7:
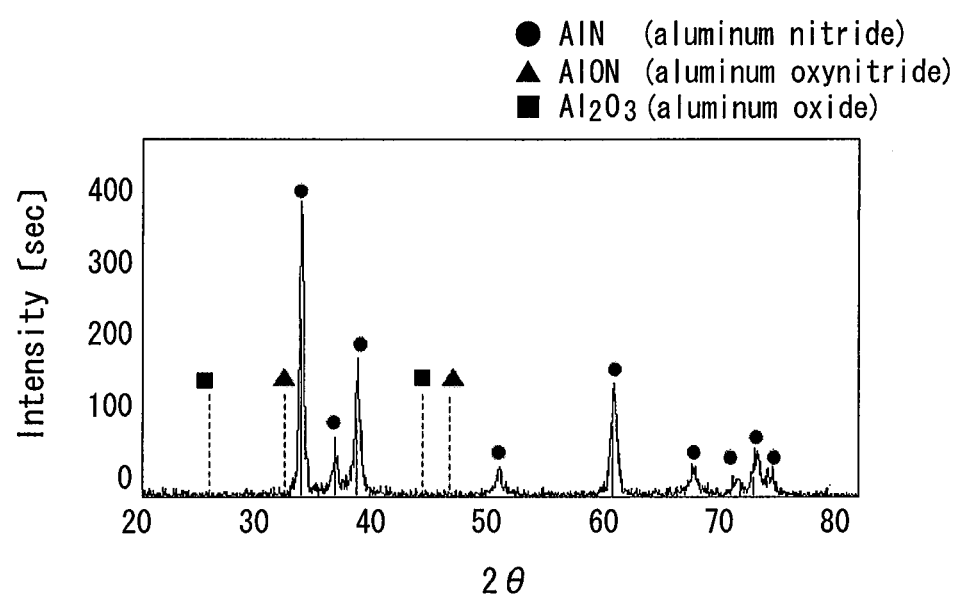
FIG. 7 is a graph showing an X-ray diffraction profile of an aluminum nitride thin film formed in Working Example 1.

As a result, an X-ray diffraction profile of the aluminum nitride thin film shown in FIG. 7 was obtained.

As shown in FIG. 7, only peaks of aluminum nitride were observed in the X-ray diffraction profile and no peak of constituent phase other than aluminum nitride was observed.

Further, a cross section of the aluminum nitride thin film was observed using an electronic microscope "VE-8800" (Product Name) manufactured and sold by KEYENCE CORPORATION and it was found that the cross section of the aluminum nitride thin film was columnar and had a high density.

Comparative Example 1

An aluminum nitride thin film having a thickness of 100 μm was formed on a base material having a size of 50 mm×50 mm×1 mm using the apparatus for forming an aluminum nitride thin film used in Working Example 1 in the same manner as that in Working Example 1 except that instead of the mixed gas prepared by mixing the ammonia gas and the oxygen gas, only the ammonia gas was fed into the internal cylinder of the apparatus for forming an aluminum nitride thin film via the external pipe of the gas supply pipe without feeding the oxygen gas into the internal cylinder.

A cross section of the thus formed aluminum nitride thin film was observed using the electronic microscope "VE-8800" (Product Name) manufactured and sold by KEYENCE CORPORATION and it was found that the cross section of the aluminum nitride thin film was a powdery film and an aluminum nitride thin film having a high density could not be formed.

Working Example 2

An apparatus for forming an aluminum nitride thin film which included a gas supply pipe including an external pipe, a middle pipe and an internal pipe and having a triplex structure as shown in FIGS. 3 and 4 and had a size of φ500 mm×1500 mm and an upright structure was prepared. Then, a base material having a size of 50 mm×50 mm×1 mm was placed on the stage and an aluminum nitride thin film was formed on the surface of the base material in the following manner.

An aluminum nitride (AlN) gas was first fed into the apparatus for forming an aluminum nitride thin film via the gas supply pipe, thereby forming an aluminum nitride thin film on the surfaces of the external cylinder made of carbon, the internal cylinder made of carbon, the heater made of carbon and the stage made of carbon. Thereafter, a member to be processed was placed on a stage of the apparatus for forming an aluminum nitride thin film.

Next, the temperature in the apparatus for forming an aluminum nitride thin film was controlled at 1,000° C. and the pressure in the apparatus for forming an aluminum nitride thin film was controlled at 100 Pa. Then, an ammonia gas was fed into the internal cylinder of the apparatus for forming an aluminum nitride thin film via the external pipe of the gas supply pipe and an oxygen gas was fed into the internal cylinder of the apparatus for forming an aluminum nitride thin film via the middle pipe of the apparatus for forming an aluminum nitride thin film, while a trimethylaluminum (TMA) gas was fed into the internal cylinder of the apparatus for forming an aluminum nitride thin film via the internal pipe of the gas supply pipe, thereby forming an aluminum nitride thin film having a thickness of 100 μm on the surface of the base material having a size of 50 mm×50 mm×1 mm.

Here, the molar ratio (Al/O) of aluminum atoms (Al) contained in the trimethylaluminum (TMA) gas fed into the internal cylinder to oxygen atoms (O) contained in the oxygen gas fed into the internal cylinder was controlled to be 1.

Next, an X-ray diffraction profile of the thus formed aluminum nitride thin film in the range between 2θ=20° to 80° was measured using "X-ray diffraction RINT-2500 VHF" (Product Name) manufactured and sold by Rigaku Corporation. As a result, it was found that only peaks of aluminum nitride were observed in the X-ray diffraction profile and no peak of constituent phase other than aluminum nitride was observed.

Further, a cross section of the aluminum nitride thin film was observed using an electronic microscope "VE-8800" (Product Name) manufactured and sold by KEYENCE CORPORATION and it was found that similarly to in Working Example 1, the cross section of the aluminum nitride thin film was columnar and had a high density.

Working Example 3

An aluminum nitride thin film having a thickness of 100 μm was formed on a base material having a size of 50 mm×50 mm×1 mm in the same manner as that in Working Example 2 except that the molar ratio (Al/O) of aluminum atoms (Al) contained in the trimethylaluminum (TMA) gas to be fed into the internal cylinder of the apparatus of the aluminum nitride thin film to oxygen atoms (O) contained in the oxygen gas to be fed into the internal cylinder of the aluminum nitride thin film forming apparatus was controlled to be 10.

Next, an X-ray diffraction profile of the thus formed aluminum nitride thin film in the range between 2θ=20° to 80° was measured using "X-ray diffraction RINT-2500 VHF" (Product Name) manufactured and sold by Rigaku Corporation. As a result, it was found that only peaks of aluminum nitride were observed in the X-ray diffraction profile and no peak of constituent phase other than aluminum nitride was observed.

Further, a cross section of the aluminum nitride thin film was observed using an electronic microscope "VE-8800" (Product Name) manufactured and sold by KEYENCE CORPORATION and it was found that similarly to in Working Example 1, the cross section of the aluminum nitride thin film was columnar and had a high density.

Working Example 4

An aluminum nitride thin film having a thickness of 100 μm was formed on a base material having a size of 50 mm×50 mm×1 mm in the same manner as that in Working Example 2 except that the molar ratio (Al/O) of aluminum atoms (Al) contained in the trimethylaluminum (TMA) gas to be fed into the internal cylinder of the apparatus of the aluminum nitride thin film to oxygen atoms (O) contained in the oxygen gas to be fed into the internal cylinder of the aluminum nitride thin film forming apparatus was controlled to be 100.

Next, an X-ray diffraction profile of the thus formed aluminum nitride thin film in the range between 2θ=20° to 80° was measured using "X-ray diffraction RINT-2500 VHF" (Product Name) manufactured and sold by Rigaku Corporation. As a result, it was found that only peaks of aluminum nitride were observed in the X-ray diffraction profile but no peak of constituent phase other than aluminum nitride was observed.

Further, a cross section of the aluminum nitride thin film was observed using an electronic microscope "VE-8800" (Product Name) manufactured and sold by KEYENCE CORPORATION and it was found that similarly to Working Example 1, the cross section of the aluminum nitride thin film was columnar and had a high density.

Comparative Example 2

An aluminum nitride thin film having a thickness of 100 μm was formed on a base material having a size of 50 mm×50 mm×1 mm in the same manner as that in Working Example 2 except that the molar ratio (Al/O) of aluminum atoms (Al) contained in the trimethylaluminum (TMA) gas to be fed into the internal cylinder of the apparatus for forming the aluminum nitride thin film to oxygen atoms (O) contained in the oxygen gas to be fed into the internal cylinder of the aluminum nitride thin film forming apparatus was controlled to be 0.1.

Next, an X-ray diffraction profile of the thus formed aluminum nitride thin film in the range between 2θ=20° to 80° was measured using "X-ray diffraction RINT-2500 VHF" (Product Name) manufactured and sold by Rigaku Corporation. As a result, it was found that not only peaks of aluminum nitride but also peaks of aluminum oxynitride were observed in the X-ray diffraction profile of the film.

Further, a cross section of the aluminum nitride thin film was observed using an electronic microscope "VE-8800" (Product Name) manufactured and sold by KEYENCE CORPORATION and it was found that although the cross section of the aluminum nitride thin film was columnar and had a high density, the resistance to thermal shock of the film was lowered and splitting occurred, possibly because aluminum oxynitride was formed.

Comparative Example 3

An aluminum nitride thin film having a thickness of 100 μm was formed on a base material having a size of 50 mm×50 mm×1 mm in the same manner as that in Working Example 2 except that the molar ratio (Al/O) of aluminum atoms (Al) contained in the trimethylaluminum (TMA) gas to be fed into the internal cylinder of the apparatus of the aluminum nitride thin film to oxygen atoms (O) contained in the oxygen gas to be fed into the internal cylinder of the aluminum nitride thin film forming apparatus was controlled to be 150.

Next, an X-ray diffraction profile of the thus formed aluminum nitride thin film in the range between 2θ=20° to 80° was measured using "X-ray diffraction RINT-2500 VHF" (Product Name) manufactured and sold by Rigaku Corporation. As a result, it was found that not only peaks of aluminum nitride but also peaks of aluminum oxynitride were observed in the X-ray diffraction profile of the film.

Further, a cross section of the thus formed aluminum nitride thin film was observed using the electronic microscope "VE-8800" (Product Name) manufactured and sold by KEYENCE CORPORATION and similarly to in Comparative Example 1, it was found that the cross section of the aluminum nitride thin film was powdery and an aluminum nitride thin film having a high density could not be formed.

Working Example 5

An aluminum nitride thin film having a thickness of 100 μm was formed on a base material having a size of 50 mm×50 mm×1 mm in the same manner as that in Working Example 1 except that nitrogen dioxide ($NO_2$) gas was used instead of an oxygen ($O_2$) gas. Here, the flow rate of the nitrogen dioxide gas was set in such a manner that the number of the oxygen atoms (O) contained in the nitrogen dioxide gas was equal to the number of the oxygen atoms (O) contained in the oxygen gas used in Working Example 1.

Next, an X-ray diffraction profile of the thus formed aluminum nitride thin film in the range between 2θ=20° to 80° was measured using "X-ray diffraction RINT-2500 VHF" (Product Name) manufactured and sold by Rigaku Corporation. As a result, it was found that only peaks of aluminum nitride were observed in the X-ray diffraction profile and no peak of constituent phase other than aluminum nitride was observed.

Further, a cross section of the aluminum nitride thin film was observed using an electronic microscope "VE-8800" (Product Name) manufactured and sold by KEYENCE CORPORATION and it was found that similarly to in Working Example 1, the cross section of the aluminum nitride thin film was columnar and had a high density.

Working Example 6

An aluminum nitride thin film having a thickness of 100 μm was formed on a base material having a size of 50 mm×50 mm×1 mm in the same manner as that in Working Example 1 except that carbon dioxide ($CO_2$) gas was used instead of an oxygen ($O_2$) gas. Here, the flow rate of the carbon dioxide gas was set in such a manner that the number of the oxygen atoms (O) contained in the carbon dioxide gas was equal to the number of the oxygen atoms (O) contained in the oxygen gas used in Working Example 1.

Next, an X-ray diffraction profile of the thus formed aluminum nitride thin film in the range between 2θ=20° to 80° was measured using "X-ray diffraction RINT-2500 VHF" (Product Name) manufactured and sold by Rigaku Corporation. As a result, it was found that only peaks of aluminum nitride were observed in the X-ray diffraction profile and no peak of constituent phase other than aluminum nitride was observed.

Further, a cross section of the aluminum nitride thin film was observed using an electronic microscope "VE-8800" (Product Name) manufactured by KEYENCE CORPORATION and it was found similarly to in Working Example 1 that the cross section of the aluminum nitride thin film was columnar and had a high density.

Working Example 7

An aluminum nitride thin film having a thickness of 100 μm was formed on a base material having a size of 50 mm×50 mm×1 mm in the same manner as that in Working Example 1 except that water vapor gas ($H_2O$) gas was used instead of an oxygen ($O_2$) gas. Here, the flow rate of the water vapor gas was set in such a manner that the number of the oxygen atoms (O) contained in the water vapor gas was equal to the number of the oxygen atoms (O) contained in the oxygen gas used in Working Example 1.

Next, an X-ray diffraction profile of the thus formed aluminum nitride thin film in the range between 2θ=20° to 80° was measured using "X-ray diffraction RINT-2500 VHF" (Product Name) manufactured and sold by Rigaku Corporation. As a result, it was found that only peaks of aluminum nitride were observed in the X-ray diffraction profile and no peak of constituent phase other than aluminum nitride was observed.

Further, a cross section of the aluminum nitride thin film was observed using an electronic microscope "VE-8800" (Product Name) manufactured and sold by KEYENCE CORPORATION and it was found that similarly to in Working Example 1, the cross section of the aluminum nitride thin film was columnar and had a high density.

Working Example 8

An aluminum nitride thin film having a thickness of 100 μm was formed on a base material having a size of 50 mm×50 mm×1 mm in the same manner as that in Working Example 1 except that an aluminum chloride gas was used instead of the trimethylaluminum gas. Here, the flow rate of the aluminum chloride gas was set in such a manner that the number of aluminum atoms (Al) contained in the aluminum chloride gas was equal to the number of aluminum atoms (Al) contained in the trimethylaluminum gas used in Working Example 1.

Next, an X-ray diffraction profile of the thus formed aluminum nitride thin film in the range between 2θ=20° to 80° was measured using "X-ray diffraction RINT-2500 VHF" (Product Name) manufactured and sold by Rigaku Corporation. As a result, it was found that only peaks of aluminum nitride were observed in the X-ray diffraction profile and no peak of constituent phase other than aluminum nitride was observed.

Further, a cross section of the aluminum nitride thin film was observed using an electronic microscope "VE-8800" (Product Name) manufactured and sold by KEYENCE CORPORATION and it was found that similarly to in Working Example 1, the cross section of the aluminum nitride thin film was columnar and had a high density.

It was found from Working Example 1 and Comparative Example 1 that in the case of feeding only the gas containing nitrogen atoms (N) and the gas containing aluminum atoms (Al) without feeding the gas containing the oxygen atoms (O) to the apparatus for forming an aluminum nitride thin film, since the gas containing nitrogen atoms (N) and the gas containing aluminum atoms (Al) reacted with each other before they arrived at the member to be processed to produce aluminum nitride particles, the aluminum nitride thin film thus formed on the member to be processed was a powdery film and an aluminum nitride thin film having a high density could not be formed. To the contrary, it was found that in the case of feeding the gas containing oxygen atoms (O) to the apparatus for forming the aluminum nitride thin film in addition to the gas containing nitrogen atoms (N) and the gas containing aluminum atoms (Al), it was possible to effectively prevent the nitrogen atoms (N) and the aluminum atoms (Al) from reacting with each other so as to produce aluminum nitride particles before the gas containing nitrogen atoms (N) and the gas containing aluminum atoms (Al) reached the member to be processed and it was possible to form an aluminum nitride thin film having a high resistance to thermal shock and having a high density.

Further, it was found from Working Examples 2 to 4 and Comparative Examples 2 and 3 that in the case of feeding the gas containing aluminum atoms (Al) and the gas containing oxygen atoms (O) to the apparatus for forming an aluminum nitride thin film in such a manner that the molar ratio (Al/O) of aluminum atoms (Al) to oxygen atoms (O) was controlled to be 1, 10 or 100, it was possible to form an aluminum nitride thin film having a high resistance to thermal shock and having a high density. To the contrary, it was found that in the case of feeding the gas containing aluminum atoms (Al) and the gas containing oxygen atoms (O) to the apparatus for forming an aluminum nitride thin film in such a manner that the molar ratio (Al/O) of aluminum atoms to oxygen atoms was 150, the thus formed aluminum nitride thin film was powdery and an aluminum nitride thin film having a high density could not be formed. On the other hand, in the case of feeding the gas containing aluminum atoms (Al) and the gas containing oxygen atoms (O) to the apparatus for forming an aluminum nitride thin film in such a manner that the molar ratio (Al/O) of aluminum atoms (Al) to oxygen atoms (O) was 0.1, the aluminum nitride thin film having a high density could be formed but the thus formed aluminum nitride thin film had a low resistance to thermal shock and split, possibly because aluminum oxynitride was formed. Therefore, it was found that it was preferable to feed the gas containing aluminum atoms (Al) and the gas containing oxygen atoms (O) to the apparatus for forming an aluminum nitride thin film so that the molar ratio (Al/O) of aluminum atoms to oxygen atoms was equal to or larger than 1 and equal to or smaller than 100 ($1 \leq Al/O \leq 100$).

Furthermore, it was found from Working Example 1 and Working Examples 2 to 4 that the structure of the gas supply pipe for feeding gases to the apparatus for forming an aluminum nitride thin film was not particularly limited insofar as the apparatus for forming an aluminum nitride thin film was constituted so that a gas containing nitrogen atoms (N) and a gas containing aluminum atoms (Al) were fed via different flow passages and that the gas supply pipe may have a double structure or a triplex structure.

Moreover, it was found from Working Examples 1, 2 and 5 to 7 that the kind of the gas containing oxygen atoms (O) was not particularly limited and it was found from Working Example 8 that the kind of the gas containing aluminum atoms (Al) was not particularly limited.

The present invention has thus been shown and described with reference to specific embodiments and Working Examples. However, it should be noted that the present invention is in no way limited to the details of the described arrangements but changes and modifications may be made without departing from the scope of the appended claims.

For example, in the above described embodiments, the apparatus for forming an aluminum nitride thin film includes the external cylinder 1 made of carbon, the internal cylinder 2 made of carbon, the heater 3 made of carbon and disposed between the external cylinder 1 and the internal cylinder 2 and the stage 4 made of carbon. However, it is not absolutely necessary for each of the external cylinder 1, the internal cylinder 2, the heater 3 and the stage 4 to be made of carbon.

Furthermore, in the above described embodiments, prior to forming an aluminum nitride thin film on the surface of the member to be processed, a gas containing a component such as pyrolytic boron nitride (pBN), pyrolytic graphite (PG), boron containing pyrolytic graphite (B-PG), aluminum nitride (AlN) and silicon carbide (SiC) or the like and containing no oxygen atom is fed into the internal cylinder 2 of the apparatus for forming an aluminum nitride thin film, thereby covering the surfaces of the external cylinder 1 made of carbon, the internal cylinder 2 made of carbon the heater 3 made of carbon and the stage 4 made of carbon with the constituent contained in the gas. However, in the case where the external cylinder 1, the internal cylinder 2, the heater 3 and the stage 4 are made of a material having a high oxidation resistance, it is not absolutely necessary to feed the gas containing a component such as pyrolytic boron nitride (pBN), pyrolytic graphite (PG), boron containing pyrolytic graphite (B-PG), aluminum nitride (AlN) and silicon carbide (SiC) or the like and containing no oxygen atom (O) into the internal cylinder 2 of the apparatus for forming an aluminum nitride thin film and cover the surface of the external cylinder 1, the surface of the internal cylinder 2, the surface of the heater 3 and the surface of the stage 4 with constituents contained in the gas.

Further, although in the preferred embodiment shown in FIGS. 1 to 5, the apparatus for forming an aluminum nitride thin film includes the rotating mechanism 5 for rotating the stage 4, it is not absolutely necessary for the apparatus for forming an aluminum nitride thin film to include the rotating mechanism 5 for rotating the stage 4.

Furthermore, the gas supply pipe 6 having a double structure including the external pipe 6a and the internal pipe 6b was used in the preferred embodiment shown in FIGS. 1 to 3 and the gas supply pipe 6 having a triplex structure including the external pipe 6a, the internal pipe 6b and the middle pipe 6c was used in the preferred embodiment shown in FIGS. 4 and 5. However, it is not absolutely necessary to use the gas supply pipe 6 having a double structure or the gas supply pipe 6 having a triplex structure. It is sufficient to constitute a gas supply pipe 6 so that a gas containing nitrogen atoms (N) and a gas containing aluminum atoms (Al) do not come into contact with each other prior to feed the gas containing nitrogen atoms (N) and a gas containing aluminum atoms (Al). Thus, the structure of the gas supply pipe 6 is not particularly limited and a plurality of gas supply pipes may be employed.

According to the present invention, it is possible to provide a method for forming an aluminum nitride thin film having a high density and a high resistance to thermal shock by a chemical vapor deposition process.

The invention claimed is:

1. A method for forming an aluminum nitride thin film comprising a step of feeding a gas containing aluminum atoms (Al), feeding a gas containing nitrogen atoms (N) and feeding a gas containing oxygen atoms (O) into an apparatus for forming an aluminum nitride thin film,
wherein the gas containing aluminum atoms (Al) and gas containing nitrogen atoms (N) are fed via different flow passages into the apparatus for forming an aluminum nitride thin film.

2. A method for forming an aluminum nitride thin film in accordance with claim 1, wherein the gas containing oxygen atoms (O) is mixed with the gas containing nitrogen atoms (N) or the gas containing aluminum atoms (Al) prior to feeding to the apparatus for forming an aluminum nitride thin film.

3. A method for forming an aluminum nitride thin film in accordance with claim 2, wherein the gas containing aluminum atoms (Al) and the gas containing oxygen atoms (O) are fed into the apparatus for forming an aluminum nitride thin film so that the molar ratio (Al/O) of aluminum atoms (Al) to oxygen atoms (O) is controlled to be equal to or larger than 1 and equal to or smaller than 100 ($1 \leqq Al/O \leqq 100$).

4. A method for forming an aluminum nitride thin film in accordance with claim 3, wherein the gas containing aluminum atoms (Al) and the gas containing oxygen atoms (O) are fed into the apparatus for forming an aluminum nitride thin film so that the molar ratio (Al/O) of aluminum atoms (Al) to oxygen atoms (O) is controlled to be equal to or larger than 5 and equal to or smaller than 30 ($5 \leqq Al/O \leqq 30$).

5. A method for forming an aluminum nitride thin film in accordance with claim 1, wherein the gas containing aluminum atoms (Al), the gas containing nitrogen atoms (N) and the gas containing oxygen atoms (O) are fed into the apparatus for forming an aluminum nitride thin film via a gas supply pipe having a double structure or a triplex structure.

6. A method for forming an aluminum nitride thin film in accordance with claim 1, wherein the gas containing oxygen atoms (O) is a gas selected from a group consisting of an $O_2$ gas, an $H_2O$ gas, an NOx gas and a COx gas.

7. A method for forming an aluminum nitride thin film in accordance with claim 1, wherein the gas containing aluminum atoms (Al) is a gas selected from a group consisting of a trimethylaluminum gas (TMA) and an aluminum chloride gas.

8. A method for forming an aluminum nitride thin film in accordance with claim 1, wherein members which are provided in the apparatus for forming an aluminum nitride thin film and are to be brought into contact with the gas containing aluminum atoms (Al), the gas containing nitrogen atoms (N) and the gas containing oxygen atoms (O) are made of carbon and which further comprising a step of feeding a gas containing a compound selected from a group consisting of pyrolytic boron nitride (pBN), pyrolytic graphite (PG), boron containing pyrolytic graphite (B-PG), aluminum nitride (AlN) and silicon carbide (SiC) and containing no oxygen atom (O) into the apparatus for forming an aluminum nitride thin film prior to feeding the gas containing oxygen atoms (O) into the apparatus for forming an aluminum nitride thin film, thereby covering a surface of the members made of carbon with the compound contained in the gas containing no oxygen atoms (O).

9. A method for forming an aluminum nitride thin film in accordance with claim 1, wherein members provided in the apparatus for forming an aluminum nitride thin film and to come into contact with the gas containing aluminum atoms (Al), the gas containing nitrogen atoms (N) and the gas containing oxygen atoms (O) are made of carbon and which further comprising a step of feeding a gas containing a compound selected from a group consisting of pyrolytic boron nitride (pBN), pyrolytic graphite (PG), boron containing pyrolytic graphite (B-PG), aluminum nitride (AlN) and silicon carbide (SiC) and containing no oxygen atom (O) into the apparatus for forming an aluminum nitride thin film and containing no oxygen into the apparatus for forming an aluminum nitride thin film prior to feeding the gas containing oxygen atoms (O) into the apparatus for forming an aluminum nitride thin film, thereby covering a surface of the members made of carbon with the compound contained in the gas containing no oxygen atoms (O).

* * * * *